United States Patent [19]
Calligaro et al.

[11] Patent Number: 5,973,966
[45] Date of Patent: Oct. 26, 1999

[54] READING CIRCUIT FOR SEMICONDUCTOR MEMORY CELLS

[75] Inventors: Cristiano Calligaro, Torre D'Isola; Paolo Rolandi, Volpedo; Roberto Gastaldi, Agrate Brianza; Guido Torelli, S. Alessio Con Vialone, all of Italy

[73] Assignee: SGS - Thomson Microelectronics, S.r.l., Agrate Brianza, Italy

[21] Appl. No.: 09/203,798

[22] Filed: Dec. 1, 1998

Related U.S. Application Data

[62] Division of application No. 08/940,115, Sep. 29, 1997.

[30] Foreign Application Priority Data

Sep. 30, 1996 [EP] European Pat. Off. ............. 96830494

[51] Int. Cl.$^6$ ................................................. G11C 16/04
[52] U.S. Cl. ................... 365/189.01; 365/168; 365/149; 365/207
[58] Field of Search ..................... 365/189.01, 189.06, 365/189.11, 149, 207, 208, 168

[56] References Cited

U.S. PATENT DOCUMENTS

| | | | |
|---|---|---|---|
| 5,218,570 | 6/1993 | Pascucci et al. ................... | 365/189.01 |
| 5,694,363 | 12/1997 | Calligaro et al. ........................ | 365/190 |
| 5,710,739 | 1/1998 | Calligaro et al. ........................ | 365/205 |
| 5,748,534 | 5/1998 | Dunlap et al. ...................... | 365/185.21 |
| 5,787,042 | 7/1998 | Morgan .................................. | 365/196 |

FOREIGN PATENT DOCUMENTS

| | | |
|---|---|---|
| 0491105 | 6/1992 | European Pat. Off. . |
| 0678871 | 10/1995 | European Pat. Off. . |

Primary Examiner—David Nelms
Assistant Examiner—VanThu Nguyen
Attorney, Agent, or Firm—Jenkens & Gilchrist P.C.

[57] ABSTRACT

A read circuit for semiconductor memory cells, comprising first and second active elements coupled to a supply line via at least a first switch, wherein the first and second active elements are respectively connected, at first and second circuit nodes, respectively, to a first transistor through which the active elements are coupled to a ground. These first and second circuit nodes are also connected to ground through first and second capacitive elements, respectively, each having a switch connected in parallel to the capacitive element.

11 Claims, 3 Drawing Sheets

READING CIRCUIT FOR SEMICONDUCTOR MEMORY CELLS

This application is a division of application Ser. No. 08/940,115, filed Sep. 29, 1997.

FIELD OF THE INVENTION

This invention relates to circuits contained in and integrated to memory cell devices and particularly to a circuit for reading memory cells by a technique which utilizes reference cells.

BACKGROUND OF THE INVENTION

In order to fill the market's steadily growing demand for higher processing capacity, computer and peripheral unit manufacturers are striving to provide faster access to the data stored in memories of both the volatile and nonvolatile types. In addition, there exists a need for lower supply voltages in order to reduce power consumption, while the development of memory cells of the multi-level type commands enhanced discriminating capabilities and more accurate reading.

Thus, a pressing problem is to provide circuitry that can give access to stored information in less time and require less power to do so, while ensuring highly reliable reading of the stored data, to thereby fill the market's demands.

The problem of high-speed reading or sensing has been tackled in several ways. Reading by reference cells involves the use of a nonvolatile memory cell identical with the memory cell being selected by decode blocks; regardless of whether the selected cell is written or not (i.e., has a high or low threshold), the reference cell is always erased (low threshold). In this way, the read circuit is comparing a low threshold cell (thereby drawing a nominal current typical of the physical characteristics of the cell) with a cell whose threshold may be high or low according to how it has been programmed. The selected cell will draw substantially the same current as the reference cell if the threshold is low and no current if the threshold is high.

A read circuit should supply the data output stages with either a high or a low logic value according to whether the threshold of the selected cell is the same as or other than that of the reference cell.

A generic reading arrangement based on the use of a reference cell is shown in FIG. 1. Its principle is that of having a generic selected cell (which may have a high or a low threshold) compared with a constantly virgin cell which, as such, will always be drawing the nominal current that characterizes it.

The reason why reading is performed by comparing a selected cell with a reference cell is that it provides an always virgin cell capable of accommodating the process variations of the array cells throughout the integrated circuit fabrication.

Reading by the reference cell technique actually is not effected by comparing any selected cell with one reference cell but rather by relating the bit line that contains the cell to be read to the reference bit line. Thus, decoding will result in two cells being selected in the same row of the array, namely, the cell to be read and the reference cell. Although the comparison is made with only one reference cell, the term reference bit line is more appropriate.

The reference bit line does solve the problems caused by process variations. The reference bit line approach, in fact, lowers the rate of variations from processing tolerances in the physical and electrical parameters between cells as brought about by the memory array being spread over a fairly large surface. Once the row (word line) is selected, the reference bit line cell and the selected memory cell are allocated to the same axis.

The advantage of the reference cell reading method over the differential cell reading method (wherein data is stored into two memory cells in its straight and negated forms) resides in its reduced silicon area requirements.

As mentioned above, connected to the bit lines are, especially in high storage capacity (4 Mbit, 16 Mbit) devices, the drains of several thousands of memory cells. The capacitances of the junctions associated with the drains of such cells add together into an overall capacitive load of several picofarads. Again, the high bit line capacity is bound to restrict the sensing speed of any reading scheme based on the amplification of a voltage signal developed at the drain of the selected cell (voltage mode operation).

Therefore, current sensing appears preferable. The data discriminating circuitry (sense amplifier) should have a low input impedance and be responsive to current, rather than voltage, signals. The advantage of this method resides basically in its low input impedance allowing the cell current to be injected into the sense amplifier without the bit line voltage undergoing any significant change. In other words, the current method enables the bit line capacitance to be allocated to a node which bears little or no influence on the stored data sensing speed. Usually, before the reading step itself, a "pre-charging" step is also carried out in order to attain optimum voltage at the bit line node for performing the reading.

Reading a cell which has the same threshold voltage as the reference cell includes a privileged reading and a difficult reading. Where the selected cell has a high threshold voltage (and, therefore, no current flowing therethrough), the comparison with the reference cell is easily carried out. With two cells having low thresholds, on the other hand, the comparison becomes more difficult; the current flowing through the two cells is the same, and the sensing circuitry is to detect this condition.

From the literature, many circuits for reading memory cells which are based on the reference cell method are known, and their possible use is tied to the supply voltage whose value tends, as mentioned above, to decrease in today's applications.

What is needed is a novel read circuit for semiconductor memory cells which is based on the reference cell method and includes the best features of conventional circuits but exhibits improved accuracy in discriminating data contained in a cell, while being specifically suitable for use in multi-level cell storage devices.

SUMMARY OF THE INVENTION

Accordingly, the present invention provides a read circuit for semiconductor memory cells, comprising first and second active elements coupled to a supply line via at least a first switch. The first and second active elements are respectively connected, at a first and a second circuit node, respectively, to first and second threshold switches through which the active elements are coupled to ground. The first and second circuit nodes are also connected to ground through first and second capacitive elements, respectively. Each node includes a switch connected in parallel to the capacitive element.

The present invention also provides a storage device comprising a read circuit as set forth above.

BRIEF DESCRIPTION OF THE DRAWINGS

The features and advantages of a read circuit according to the invention will be apparent from the following description of an embodiment given by way of example and not of limitation with reference to the accompanying drawings.

DETAILED DESCRIPTION OF A PREFERRED EMBODIMENT OF THE INVENTION

Figure 2:
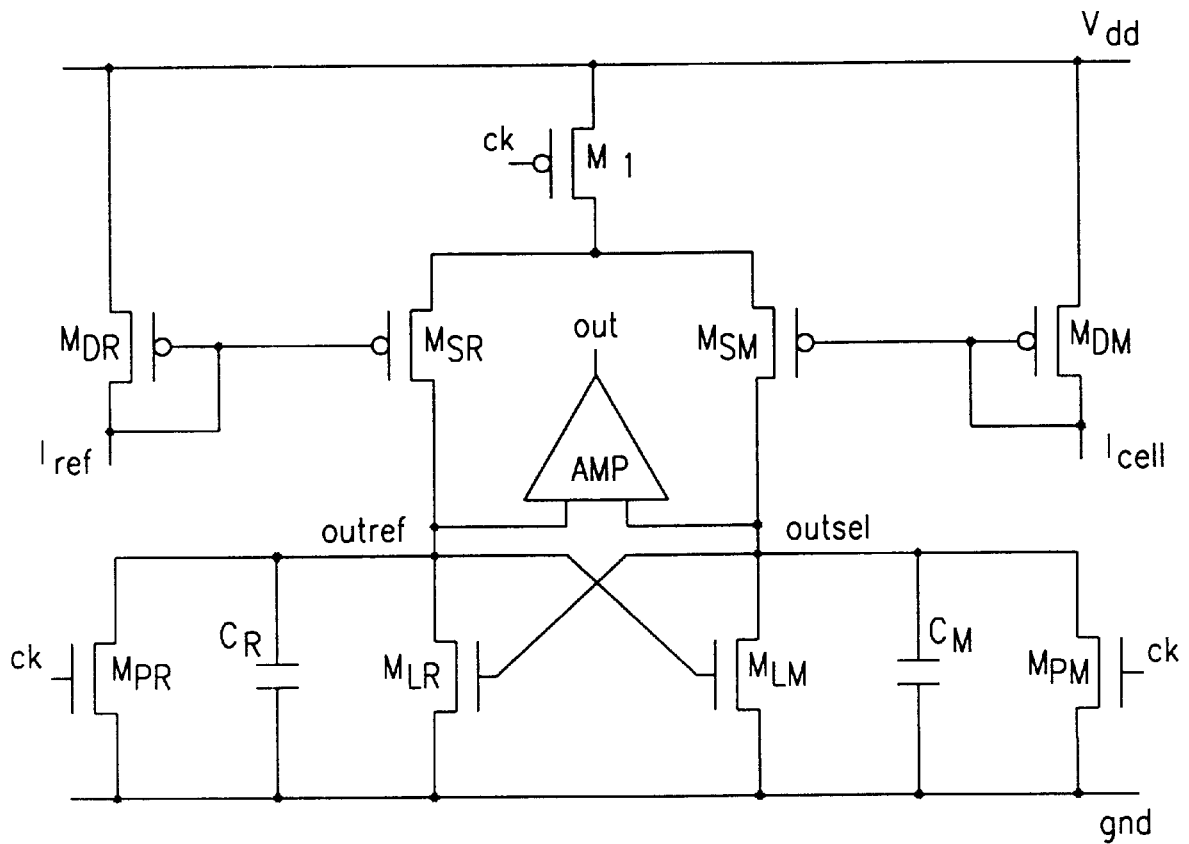
FIG. 2 is a diagram of a memory cell read circuit according to the invention.

Shown in FIG. 2 is a read circuit for non-volatile memory cells which is based on having capacitors charged through current mirrors and in which the current of the reference cell(s) and the array cell is mirrored onto the capacitors. The principle underlying this reading technique is to arrange for capacitors to be charged, after being discharged during the step of pre-charging the bit lines which contain the reference cells and the memory cells in the array.

The reading operation includes two distinct steps: a first step is the so-called pre-charging step whereby the reference bit line and the memory array bit line are charged to a voltage of 1 volt in order to bring the memory cell to be read to an optimum current supply condition; the second step is the reading step proper and, according to the technique being used, may be carried out in either a voltage or a current mode.

Figure 1:
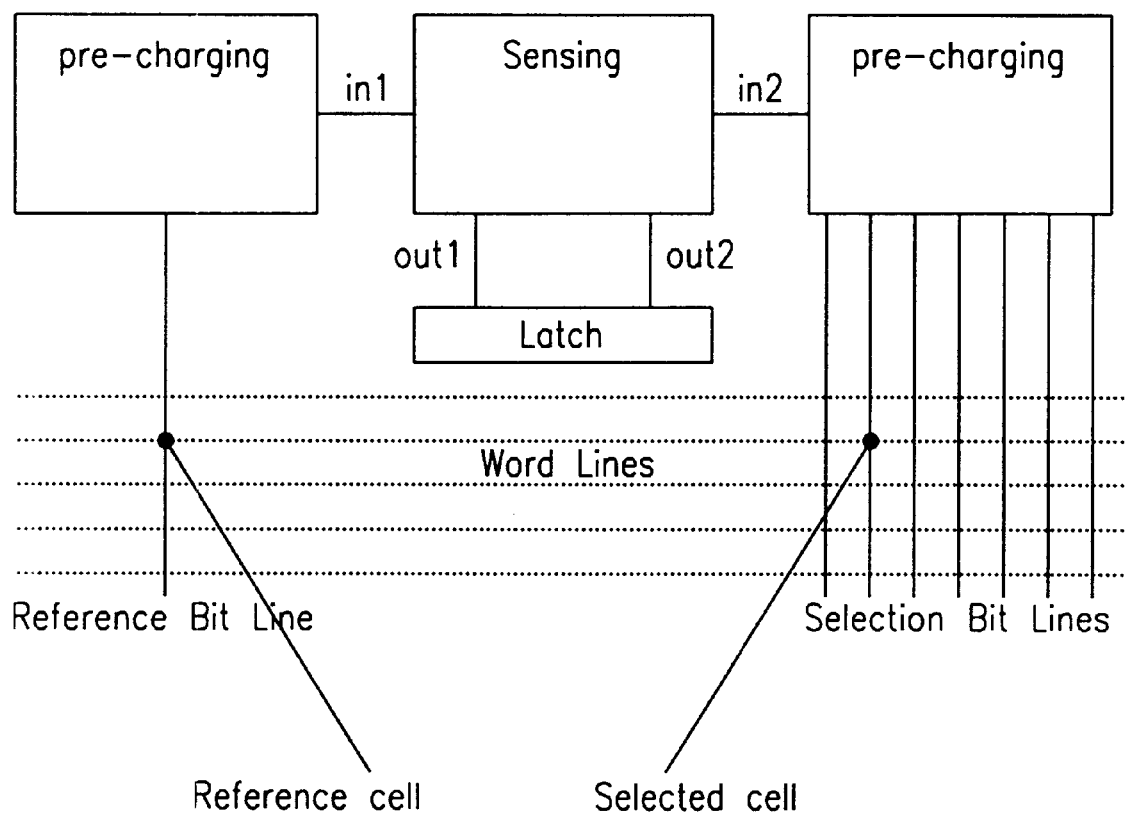
FIG. 1 is a block diagram of a conventional memory cell read circuit using the reference cell method technique.

A circuit according to the invention utilizes this technique in that the array cell and reference cell currents are mirrored onto two capacitors $C_R$ and $C_M$ which, according to the known law of capacitor charging, begin to produce increasing voltages at nodes outref and outsel (see FIG. 1) depending on the current value delivered by the two cells.

During the pre-charging step (signal ck "high"), the circuit will be inhibiting the sensing structure, whose P-channel transistor $M_1$ and N-channel transistors $M_{PR}$ and $M_{PM}$ actually serve as switches to provide a ground connection for the nodes outref and outsel at the same time as the currents from the bit lines are being mirrored during the pre-charging step.

At the end of the pre-charging step, the reading step (signal ck low) begins; the sensing circuit is enabled and transistors $M_{SR}$ and $M_{SM}$, being enabled by $M_1$, can mirror the currents $I_{ref}$ and $I_{cell}$ from the respective reference and array branches. The two capacitors begin to be charged and, according to the current value being delivered from the mirrors, their voltage values will increase in different ways. Thus, if a larger current $I_{cell}$ is delivered from the array side than the current $I_{ref}$ from the reference side, the voltage at the node outsel will increase at a faster rate than at the node outref. This evolution of the signal allows for the use of a fairly simple output structure AMP, out, such as a differential amplifier or the like, which combines enhanced circuit compactness with correspondingly high accuracy and speed of operation.

From the circuit standpoint, the size of the capacitors $C_R$ and $C_M$ is highly important; in fact, too low a capacitance value would result in excessively fast, and hence inherently inaccurate, charging due to sensitivity to variations in the integration process. Conversely, high capacitance values would not only result in too slow a reading operation, but also in unacceptably high silicon area occupation. Accordingly, a compromise must be struck between speed and integration area requirements on the one hand, and accuracy on the other.

The concept of charging the capacitors at different slopes represents a simple and fairly safe method, but it is a technique that, once the capacitors being charged reach the asymptote, can provide no useful information for the next differential stage AMP. In fact, without the N-channel transistors $M_{LR}$ and $M_{LM}$, the circuit would evolve to "saturation" of the nodes outref and outsel at the supply voltage, so that at the end of the transient it would no longer be possible to discriminate the currents from the reference cells and the array.

Thus, an important feature of the invention is the provision of the transistors $M_{LR}$ and $M_{LM}$ in the circuit shown in FIG. 2. From the time the trailing edge of the signal ck initiates the reading step, the capacitors begin to be charged and the nodes outref and outsel rise in voltage; of course, the rising times are different, and one of the two nodes will be first to attain a voltage (threshold voltage) driving the transistor connected to the opposite branch to discharge the slower circuit counterpart.

Assuming, for instance, that the array cell is producing a larger current than the reference cell, the capacitor $C_M$ will be charged at a faster rate than the capacitor $C_R$, to result in a faster increase of the voltage at the node outsel than at outref. Upon the node outsel reaching the threshold voltage of the transistor $M_{LR}$, the latter will tend to go on and discharge the capacitor $C_R$. Since $C_R$ already becomes charged at a slower rate because of the smaller current mirrored by the reference cell, the process will be further slowed by $C_R$ being discharged through $M_{LR}$.

In the meantime, however, $C_M$ continues to be charged according to the capacitor charging law, and consequently, the voltage at the node outsel also continues to rise; however, this means increased "overdriving" of transistor $M_{LR}$, which transistor will begin, at a certain point, not only to interfere with the discharging of $C_R$, but also to discharge it back to ground level.

Thus, the two nodes in the steady-state will be at logic values of potentials Vdd and gnd, with the big advantage that the next cascaded differential stage is able to output the data in a stable manner without resorting to structures for storing the reading performed and related read or strobe signals for driving them.

It should be emphasized that this type of sensing is based more on the capacitor charging than the operation of the cross structure of the transistors $M_{LR}$ and $M_{LM}$. The sensing itself is effected during the charging. The transistors $M_{LR}$ and $M_{LM}$ serve to keep the data stable and prevent the capacitor that is discharging at a slower rate from attaining the charging asymptote.

Practical Applications

The proposed circuit can be used with two-level cells of the standard type as well as with cells of the new multi-level type. With a two-level technique, the reference is represented by a memory cell when an intermediate current is flowing between the maximum value delivered by the cell and zero; in this way, when the comparison is effected between a cell which is delivering no current and the reference cell, the latter will tend to charge the reference capacitor $C_R$ at a faster rate, whereas the steady-state capacitor $C_M$ is in a discharged state. On the other hand, when the array cell is virgin, it will tend to discharge the capacitor $C_M$ at a faster rate to give rise to the opposite situation from that previously described.

For memory cells of the multi-level type, with four levels and a technique of the parallel type [see C. Calligaro, V. Daniele, E. Castaldi, A. Manstretta, N. Telecco, C. Torelli, "Reading circuit for multilevel non-volatile memory cell devices", Pat. Dep. SGS-Thomson, Europe (FR DE GB IT), No. 95830127.7 (1995), incorporated herein by reference], three references are needed for the read operation, and the cell current must be not only mirrored but also duplicated thrice, so that it can be compared with the above-described references by three circuits of the type of FIG. 2.

Of course, the references should be programmed with suitable threshold values such that the cells leading to them can deliver currents having intermediate values to the values that the generic array cell can take.

A practical example for a multi-level of four levels is the following:

| | |
|---|---|
| 1st cell level (virgin) | 100 $\mu$A |
| 2nd cell level | 70 $\mu$A |
| 3rd cell level | 40 $\mu$A |
| 4th cell level | 0 $\mu$A | whereas for references:

| | |
|---|---|
| 1st reference | 85 $\mu$A |
| 2nd reference | 55 $\mu$A |
| 3rd reference | 25 $\mu$A |

In this way, all currents will be different and regardless of the cell being selected, it will always locate between an upper and a lower reference. The capacitors will therefore be charged always with different times, and this will cause the differential stages connected to the nodes outref and outsel to output univocal conditions for the cell being read.

Figure 3:
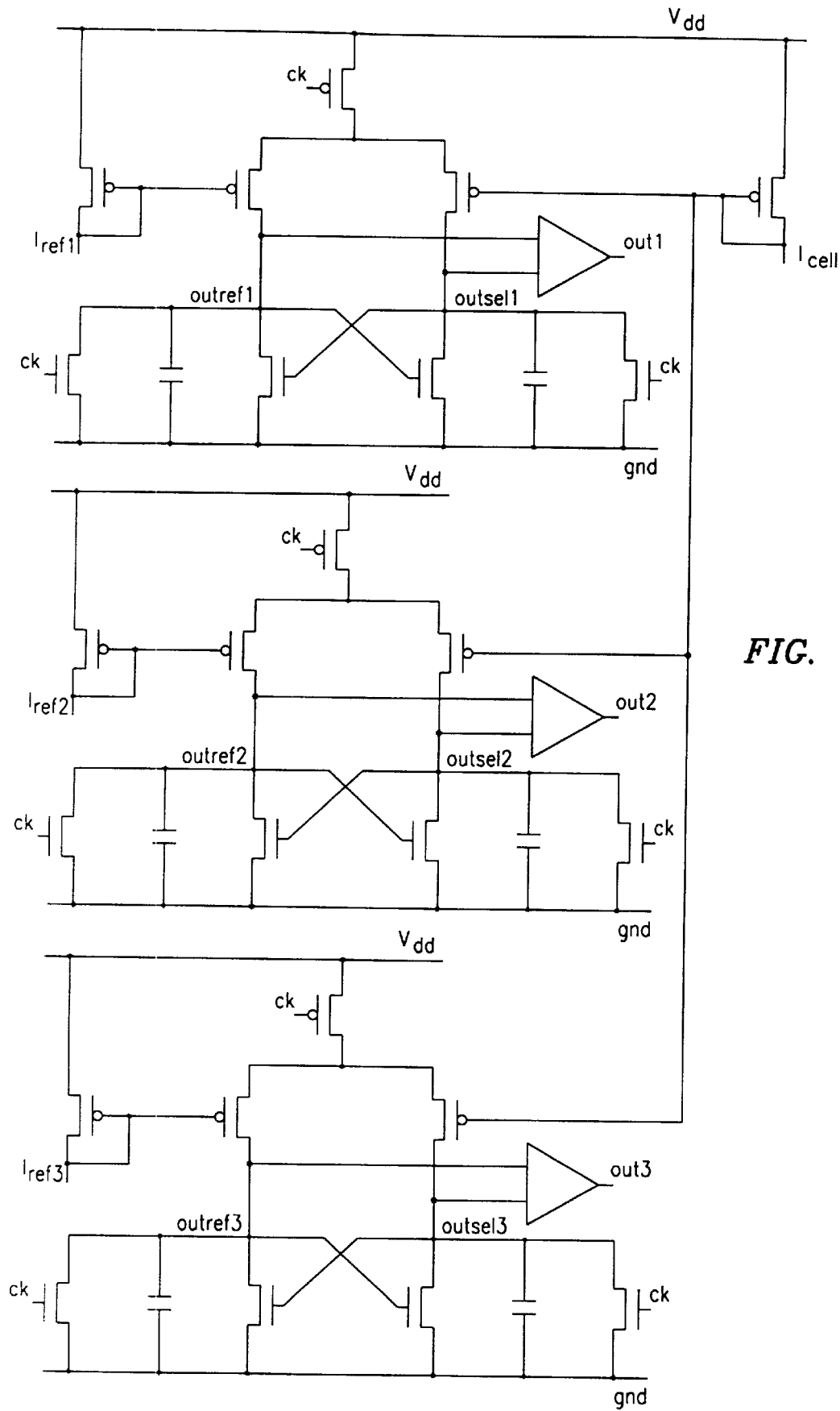
FIG. 3 illustrates an application for reading multi-level cells, specifically four-level cells.

Shown in FIG. 3 is the circuit structure of this invention for this example of a four-level reading wherein reference numerals which are identical, like or similar to the reference numbers used in FIG. 2 indicate identical, like or similar components.

The present sense circuit can also be used for multi-level readings of the serial and serial dichotomic types (C. Calligaro, V. Daniele, R. Gastaldi, A. Manstretta, C. Torelli, "Serial dichotomic method for sensing multiple levels non-volatile memory cells, and sensing circuit acting such method"; C. Calligaro, V. Daniele, R. Gastaldi, N. Telecco, A. Manstretta, C. Torelli, "Sensing circuit for serial dichotomic sensing of multiple levels non-volatile memory cells", Pat. Dep. SGS-Thomson, Europe (FR DE GB IT), No. 95830110.3 (1995), incorporated herein by reference], although the parallel-type technique just described is the most natural.

To summarize, the proposed circuit includes at least the following novel features:

the use of charged capacitors as reading elements; and the use of transistors with their gates driven by output nodes to discharge the node connected to the slowest-charged capacitor, so as to first slow down and then fully discharge the slow capacitor.

Of course, one skilled in the art could apply changes and substitutions in the inventive circuit described hereinabove.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit and scope of the present invention as limited solely by the appended claims.

What is claimed is:

1. A read circuit for semiconductor memory cells of a n-level type, comprising at least n−1 read circuits for reading at least one of said semiconductor memory cells, including:

first and second active elements coupled to a supply line via at least a first switch;

said first and second active elements respectively connected, at a first and a second circuit node, respectively, to first and second threshold switches through which the active elements are coupled to ground; and wherein said first and second circuit nodes are also connected to ground through first and second capacitive elements, respectively, each node having a switch connected in parallel to the capacitive element.

2. The read circuit according to claim 1, wherein each of the first and second threshold switches has a control terminal, with the control terminal of the first threshold switch being connected to the second circuit node and the control terminal of the second threshold switch being connected to the first circuit node.

3. The read circuit according to claim 2, wherein the first and second active elements are respectively driven through first and second input circuit elements, and the first and second circuit nodes are connected to a differential output stage.

4. The read circuit according to claim 2, wherein the switches connected in parallel to the first and second capacitive elements operate at different time intervals to produce phases which do not overlap those phases with which the first switch operates.

5. The read circuit according to claim 1, wherein the first and second active elements are respectively driven through first and second input circuit elements, and the first and second circuit nodes are connected to a differential output stage.

6. The read circuit according to claim 5, wherein the input circuit elements are diode-connected transistors.

7. The read circuit according to claim 6, wherein the switches connected in parallel to the first and second capacitive elements operate at different time intervals to produce phases which do not overlap those phases with which the first switch operates.

8. The read circuit according to claim 7, wherein the active elements and switches are transistors of the MOS type and the capacitive elements are capacitors.

9. The read circuit according to claim 5, wherein the switches connected in parallel to the first and second capacitive elements operate at different time intervals to produce phases which do not overlap those phases with which the first switch operates.

10. The read circuit according to claim 1, wherein the switches connected in parallel to the first and second capacitive elements operate at different time intervals to produce phases which do not overlap those phases with which the first switch operates.

11. A multi-level memory cell device, comprising a read circuit for semiconductor memory cells of the n-level type, comprising at least n−1 read circuits for reading at least one of said semiconductor memory cells, including:

first and second active elements coupled to a supply line via at least a first switch;

said first and second active elements respectively connected, at a first and a second circuit node, respectively, to first and second threshold switches through which the active elements are coupled to ground; and wherein said first and second circuit nodes are also connected to ground through first and second capacitive elements, respectively, each node having a switch connected in parallel to the capacitive element.

* * * * *